United States Patent [19]
Frijlink

[11] Patent Number: 4,758,868
[45] Date of Patent: Jul. 19, 1988

[54] BALLISTIC HETERO-JUNCTION TRANSISTOR WITH TRANSVERSE TWO DIMENSIONAL ELECTRON GAS LAYER

[75] Inventor: Peter M. Frijlink, Grigny, France

[73] Assignee: U.S. Philips Corporation, New York, N.Y.

[21] Appl. No.: 112,030

[22] Filed: Oct. 21, 1987

Related U.S. Application Data

[63] Continuation of Ser. No. 455,343, Jan. 3, 1983, abandoned.

[30] Foreign Application Priority Data

Jan. 18, 1982 [FR] France ................. 82 00682

[51] Int. Cl.[4] .......................................... H01L 29/161
[52] U.S. Cl. ........................................ 357/16; 357/22; 357/34; 357/56; 357/58
[58] Field of Search ................. 357/16, 22, 34, 56, 357/58

[56] References Cited

U.S. PATENT DOCUMENTS

| | | | |
|---|---|---|---|
| 4,163,237 | 7/1979 | Dingle et al. | 357/22 |
| 4,194,935 | 3/1980 | Dingle et al. | 357/22 |
| 4,366,493 | 12/1982 | Braslau et al. | 357/72 A |
| 4,414,557 | 11/1983 | Amemiya et al. | 357/16 |
| 4,424,525 | 1/1984 | Mimura | 357/22 |
| 4,455,564 | 6/1984 | Delagebeaudeuf et al. | 357/16 |
| 4,460,910 | 7/1984 | Chappell et al. | 357/16 |
| 4,482,910 | 11/1984 | Nishizawa et al. | 357/16 |

OTHER PUBLICATIONS

T. Mimura et al., "A New FET ... Heterojcns," JAP, J.A.P., vol. 19, #5, May 1980, pp. 6225-6227.

Primary Examiner—Joseph E. Clawson, Jr.
Attorney, Agent, or Firm—Jack Oisher; Steven R. Biren

[57] ABSTRACT

The invention relates to a semiconductor device of the hetero-junction transistor type comprising a stack of semiconductor layers which in combination constitute the source, drain and gate regions, while the current path between the source and drain regions is substantially at right angles to the various junctions. The gate region constitutes an electron accumulation region in the form of a two-dimensional quasi Fermi-Dirac gas which can be brought to the desired polarization potential of at least one gate electrode, while the electrons forming the source-drain current traverse this electron cloud without having a strong interaction with it, in ballistic or quasi-ballistic conditions.

11 Claims, 4 Drawing Sheets

BALLISTIC HETERO-JUNCTION TRANSISTOR WITH TRANSVERSE TWO DIMENSIONAL ELECTRON GAS LAYER

This is a continuation of application Ser. No. 455,343, filed Jan. 3, 1983, now abandoned.

BACKGROUND OF THE INVENTION

The invention relates to a semiconductor device of the hetero-junction transistor type comprising a stack of semiconductor layers which constitute a source region, a gate region and a drain region, while the current path established between the said source and drain regions is substantially at right angles to the various junctions.

Hetero-junction structures are well known from the prior art as designed and tested in the years 1950 ff. However, although they have very interesting potential properties superior to those of homo-junctions, they have been developed to only a small extent, except perhaps in opto-electronic devices, such as lasers. Thus, although numerous books and publications have appeared about semiconductor hetero-junction devices, the main applications developed for the market are of the homo-junction type.

One of the reasons for this slow development of hetero-junction devices resides in the poor crystalline and electrical quality of the layers at the interfaces due to the growing methods utilized thus far, which result in a considerable recombination of the charge carriers at the interfaces.

The novel growing methods developed since then, such as, for example, epitaxy from the vapor phase with the use of organometallic compounds, molecular beam epitaxy and other methods, have reduced to a large extent the aforementioned disadvantages and improved the steepness of the transitions and the freedom of choice of the configurations of the conduction bands.

Consequently, hetero-junction semiconductor devices have become more popular.

A recent example of a patent application for a hetero-junction semiconductor device is the European patent application EP No. 0 027 761 which discloses a horizontal transistor, the gate region of which comprises a P/N hetero junction (GaAsP/Ga$_{1-x}$Al$_x$AsN), in which a charge inversion layer is formed for a positive polarization of the gate region.

SUMMARY OF THE INVENTION

A semiconductor device according to the present invention is constituted by a stack of semiconductor layers forming by combination the source, gate and drain regions, while the path of the current flowing from the source to the drain is substantially at right angles to the various junctions.

Such hetero-junction semiconductor devices are generally known from the prior Art; reference is made, for example, to U.S. Pat. No. 4,119,994, which discloses hetero-junction transistors of the conventional type, in which one zone of a first conductivity type (designated as the base zone) is arranged between two zones of a second conductivity type (designated as emitter zone and collector zone).

The semiconductor device according to the present invention does not belong to the transistors of this type; a novel structure is concerned, which belongs to the category of transistors in which all charge transport take place by electrons forming majority carriers. The device utilizes both ballistic transport or quasiballistic transport for the current flowing from source to drain and the conduction in a two-dimensional quasi Fermi-Dirac gas for the conduction in the gate. The current carriers flowing from source to drain traverse this Fermi-gas perpendicularly or substantially perpendicularly without having a strong interaction with the carriers forming the said gas.

Since at least 1970 numerous publications have appeared concerning ballistic transport and reference is made to the article in I.E.E.E. Transactions on Electron Devices, Vol. ED-26, no. 11, November 1979, entitled: "Ballistic transport in semiconductor at low temperatures for low-power high-speed logic" by M. S. SHUR and L. F. EASTMAN.

The two-dimensional electron gas in the proximity of a hetero-junction is described, for example, in the article of H. L. STORMER et al entitled: "Two-dimensional electron gas at a semiconductor-semiconductor interface" in "Solid State Communications", Vol. 29, p. 705-709, 1979.

The semiconductor device according to the present invention is characterized in that the gate region is constituted by a layer of a first semiconductor material which forms a hetero-junction with the immediately adjacent layer of the drain region of a second semiconductor material, while the first and second semiconductor materials are chosen so that at the hetero-junction the lower level of the conduction band in the first semiconductor material is situated below the lower level of the conduction band in the second semiconductor material, and under the influence of the component of the electric field at right angles to the hetero-junction there is formed in the first semiconductor material in the proximity of the hetero-junction an accumulation of electrons in a potential well, the lower level of which is controlled by a gate electrode, in that the source region comprises at least one layer of a third semiconductor material chosen so that the lower level of the conduction band in the third semi-conductor material can be made higher than the lower level of the conduction band in the second semiconductor material by means of the polarization voltage applied thereto, and in that the said gate region is freed from impurities and is thinner than the free mean path of the charge carriers.

Thus, due to a difference in electron affinity between the first and the second semiconductor material, free electrons are transferred and are accumulatd in the potential well which has formed in the first semiconductor material in the proximity of the hetero-junction, and constitues a two-dimensional quasi Fermi-Dirac gas. The gate function is then obtained in an almost immaterial manner by this electron cloud which by an electrode can be brought to the desired polarization potential. The electrons forming the source-drain current thus traverse this electron cloud without having a strong interaction with it.

BRIEF DESCRIPTION OF THE DRAWING

The invention will now be described more fully, by way of example, with reference to the accompanying drawing, in which.

DESCRIPTION OF THE PREFERRED EMBODIMENTS

Figure 1:
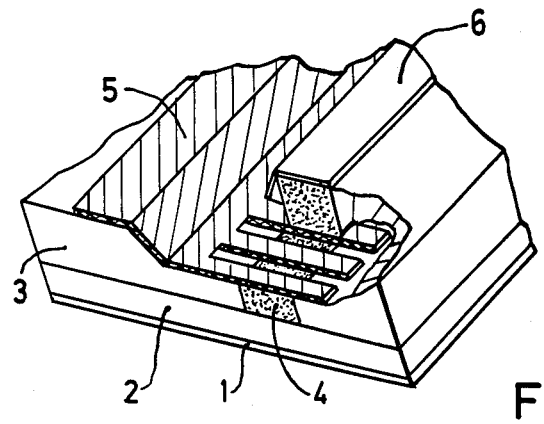
FIG. 1 shows a device according to the prior art, the structure and the operation of which are related to the invention.

The semiconductor device according to the prior art shown in FIG. 1 is derived from the article "Fabrication and Numerical Simulation of the Permeable Base Transistor" by C. O. BOZLER and G. D. ALLEY in I.E.E.E. Transactions on Electron Devices, Vol. ED-27, no. 6, June 1980. An ohmic emitter contact 1 is made on a highly doped n+-type region 2 of gallium arsenide; the flow of electrons emitted by this contact 1 is confined by insulating regions 3 obtained, for example, by a proton bombardment in a normally doped n-type region 4 and thus traverses a gate 5 constituted by a multitude of fingers embedded in the semiconductor substance in order to finally obtain the collector contact 6, which is likewise ohmic.

The gate 5 is made, for example, of tungsten, which establishes a Schottky contact with the gallium arsenide; it serves to control the flow of electrons which passes from the emitter to the collector in a manner somewhat analogous to a vacuum triode in spite of the important part played by the diffusion currents in this device.

With such a device the maximum transition frequency (the current amplification is equal to unity) is defined generally by the formula;

$$f_T = \frac{g_m}{2\pi C_T}$$

in which $g_m$ represents the transconductance and $C_T$ is calculated from the overall charge variation in the semiconductor $\Delta Q_T$ produced by a variation of the potential of the gate electrode $\Delta V_{GS}$ as follows:

$$C_T = \frac{\Delta Q_T}{\Delta V_{GS}}$$

The devices thus realized have a maximum frequency $f_T$ as defined above of the order of 40 GHz. The cut-off frequency or the maximum operating frequency is of the order of 10 GHz.

Figure 2:
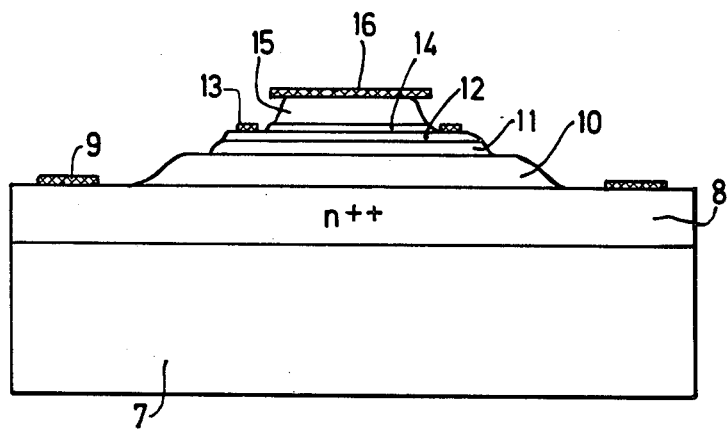
FIG. 2 shows an embodiment of the device in accordance with the invention.

A device according to the present invention is shown in a sectional view in FIG. 2. On a semi-insulating substrate 7, for example, of gallium arsenide doped with chromium, there is grown epitaxially a strongly doped semiconductor layer 8 of the n++ conductivity type and with a doping of the order of $10^{18}$ atoms/cm³ obtained, for example, by the introduction of silicon impurities and of a non-critical thickness, for example, 0.5 μm. This layer 8 serves as drain electrode and an ohmic contact 9, for example, of an alloy of gold-germanium, can be made on the periphery of the device, for example, in the form of a crown.

On this very highly doped layer 8 is formed a weakly doped layer 10 of the n-conductivity type with a doping of, for example, $10^{16}$ atoms/cm³, which layer may even be undoped and may consist of a semiconductor material, such as gallium arsenide, and have a thickness of approximately 0.5 μm. This layer 10 mainly serves to separate the layer 8 from the upper layers and thus to reduce the capacity between the drain electrode constituted by the strongly doped layer 8 and the two-dimensional Fermi-Dirac gas serving as the gate electrode in the layer 12, while also increasing the drain gate breakdown voltage.

The layer 11 is a layer of a second semiconductor material, for example of gallium aluminum arsenide $Ga_{1-x}Al_xAs$ having a thickness of the order of 100 nm. This layer 11 participates in the formation of the potential well as follows:

it serves as a barrier to prevent the electrons contained in the potential well from migrating towards the drain under the influence of the electric field;

it must not form a barrier for the electrons originating from the source and its height is therefore limited so that the Kinetic energy of these electrons exceeds it;

in a particular modification, it is possible to use this barrier for modulating the number of electrons originating from the source which reach the drain.

According to a first embodiment of the invention, this layer 11 is composed of weakly n-doped $Ga_{1-x}Al_xAs$ with a constant and sufficient value of x. According to a second embodiment of the invention, this layer 11 is in fact constituted by three zones, that is to say in the proximity of the junction with the upper layer 12 a first undoped zone having a thickness of approximately 5 nm and a value of x varying continuously between about 0.2 and 0.3 then a second very highly doped zone of the n++ conductivity type having a doping level of $10^{18}$ atoms/cm³, a thickness of approximately 10 nm and a value for x which is constant at about 0.3, and finally a third undoped zone having a thickness of approximately 85 nm and a value of x which is constant at about 0.3 over the major part of the zone and then decreases towards the end of the zone, for example, in a linear manner.

Finally, according to a third embodiment, this layer 11 is undoped, is made of gallium aluminum arsenide $Ga_{1-x}Al_xAs$ and has a value of x varying stepwise, as in the preceding embodiment.

Figure 5:
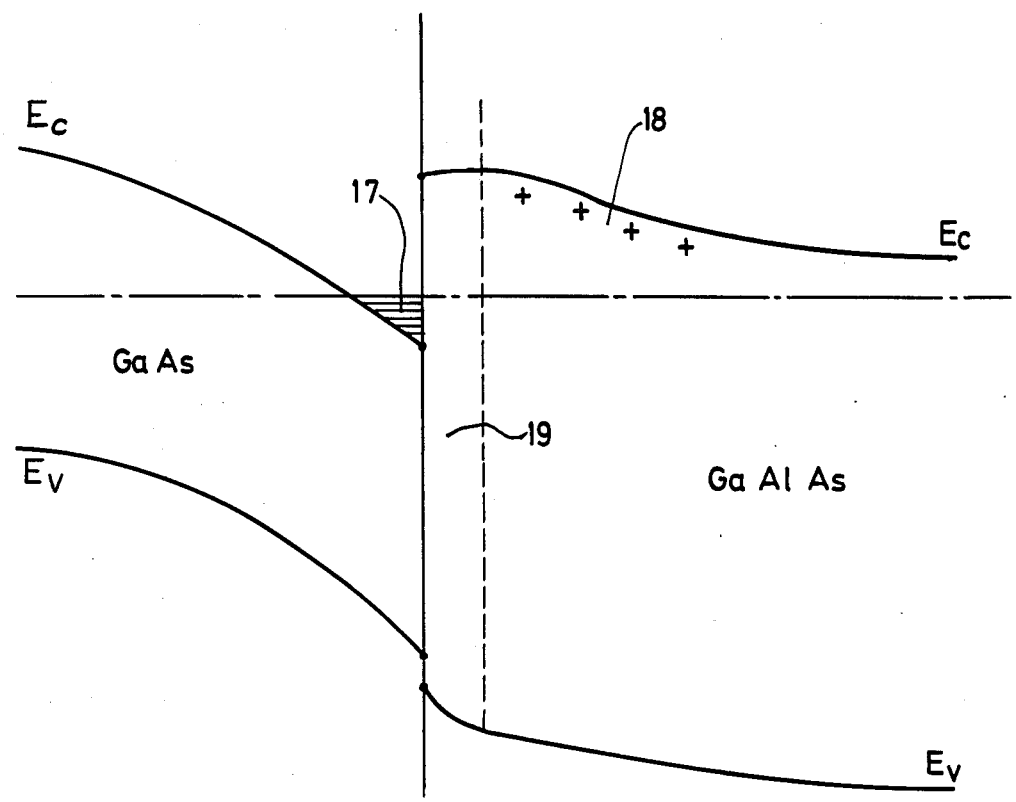
FIG. 5 shows schematically the diagram of bands in the proximity of the main hetero-junction.

The layer 12 is a layer made of another semiconductor compound chosen so that its lower level of the conduction band is situated below the lower level of the band of conduction of the layer 11 and that under the influence of the component of the electric field at right angles to the hetero-junction between the two aforementioned layers 11/12 a potential well is formed therein; the curvature of the conduction band has to be sufficient so that the lower level exceeds the Fermi level in the proximity of the hetero-junction, thus authorizing an accumulation of electrons in this proximity, as is shown in FIG. 5, which will be described in greater detail hereinafter.

According to an embodiment of the invention, the layer 11 being made of gallium aluminum arsenide $Ga_{1-x}Al_xAs$, the layer 12 is made of undoped gallium arsenide GaAs.

A possible example of the choice of the materials constituting the layers 11 and 12 is the pair GaAlAs/GaAs, but other materials may also be used.

However, taking into account the knowledge and experiments regarding this subject matter, the Applicant has preferred the use of the pair GaAlAs/GaAs, which has the advantage of an equivalent structure and crystal lattice, without a noticeable disturbance of the crystalline order.

In this layer 12 of undoped GaAs, due to its larger electronic affinity with respect to the layer 11 of $Ga_{1-x}Al_xAs$, free electrons are transferred and are thus accumulated at the lowest energy levels which are completely unoccupied and are situated between the lower level of the conduction band and the Fermi level. This electronic enhancement zone occupies a very small thickness of less than 5 nm in a layer of GaAs having a thickness of approximately 50 nm which constitutes the so-called gate region of this novel structure. The gate contact capable of controlling the Fermi level (or quasi level) of the aforementioned gate region is obtained by a layer 13 in ohmic contact with the said layer 12 of GaAs deposited, for example, in the form of a crown on the periphery of this intermediate plate, for example, a gold layer disposed on a germanium layer.

The source region of the novel device is constituted by the assembly of the layers 14 and 15 on which a source electrode 16 is deposited. The layer 14 is an intermediate layer between the layer 15 serving as electron source and the lower layers of the gate region. The main function of this layer 14 is to give the electrons leaving this layer 14 and entering the lower layer 12 of the gate region, in a direction at right angles to the interface between the two aforementioned layers 14/12, a mean kinetic energy about equal to the difference in electronic affinity between the materials forming these layers designated as third and first semiconductor materials for the layers of the source and gate regions, respectively.

According to an embodiment of the invention, the layer 14 is made of undoped gallium aluminum arsenide having a small thickness of, for example, 25 nm.

The layer 15 constituting the electron source is also made of gallium aluminum arsenide, which, however, is very highly n-doped and has a doping level of more than $10^{18}$ atoms/cm$^3$ and a non-critical thickness of, for example, 200 nm. The source electrode is obtained in the form of an ohmic contact 16. According to an embodiment, the latter can be realized in the form of a layer of gallium arsenide of n-conductivity type doped, for example, with arsenic at $10^{20}$ atoms/cm$^3$ and on which finally a metallic contact is made, for example, by a deposition of gold or aluminum.

Figure 3:
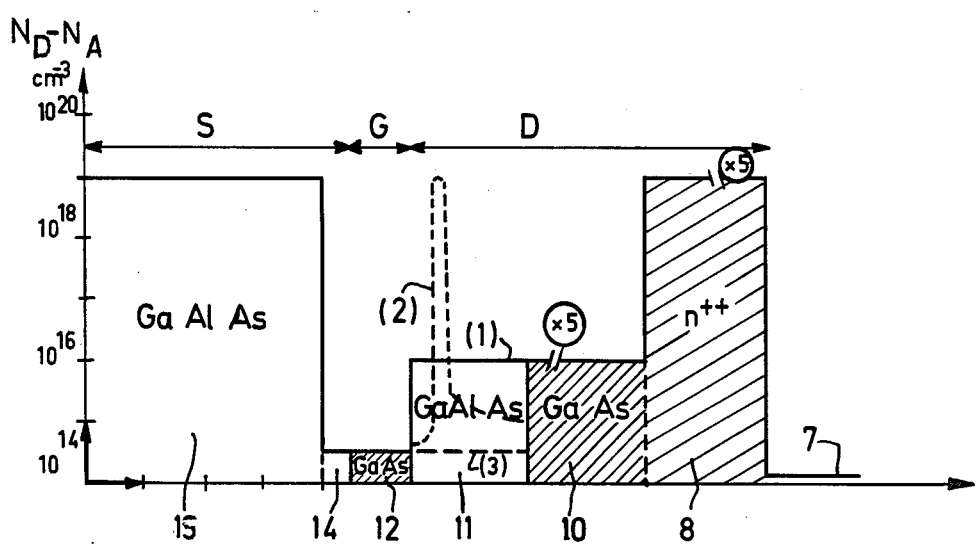
FIGS. 3 and 4 show the variations of the doping and of the aluminum percentage of the various GaAlAs/GaAs layers of an embodiment of the device according to the invention.

FIG. 3 shows the variations of the doping in number of atoms per cm$^3$. The thickness of the layers (one unit is 50 nm) is plotted substantially on the abscissa while the doping, which varies substantially from $10^{14}$ (intrinsic semiconductor) to $10^{19}$ atoms/cm$^3$ (semiconductor of the $n^{++}$-type), is plotted on the ordinate. The doping of n-conductivity type of the semiconductor compounds GaAs and $Ga_{1-x}Al_xAs$ is effected, for example, by atoms of impurities, as silicium (Si) or selenium (Se). The substrate is semi-insulating and is obtained, for example, by doping gallium arsenide (GaAs) with chromium (Cr). The various source, gate and drain zones are also represented in this Figure by the symbols S, G and D, respectively. Moreover, dotted lines indicate the various aforementioned embodiments.

Figure 4:
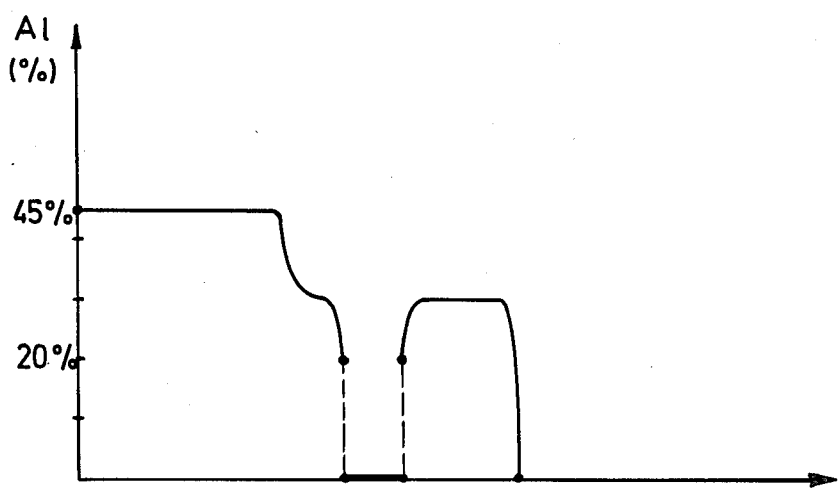

FIG. 4 shows the variations of the value x of the compound $Ga_{1-x}Al_xAs$ in the case of the described embodiment with the pair GaAs/GaAlAs. From a source region in the form of a plate with a value x of, for example, 0.45, an inflection is found at about 0.3 (layer 14) until a value of about 0.2 is attained, which inflection corresponds to a change in the slope of the curve which represents the aforementioned variations. Symmetrically, a second plate-shaped region with a value x of, for example, 0.3 (layer 11) is attained after an equivalent and symmetrical inflection at about x=0.2.

The inflection with a change of the slope of the curves of the variations of the concentration x of aluminum of the compound $Ga_{1-x}Al_xAs$ mainly has for its object to smooth the curve of the band levels at the interface in order to reduce the quantous inflection phenomenon which occurs during the passage of an electron in the proximity of a discontinuity of the potential.

FIG. 5 shows the band diagram on both sides of the main hetero-junction. The lefthand part of the band diagram represents the material GaAs and the righthand part the material $Ga_{0.7}Al_{0.3}As$ (by way of example). In such a band diagram, the symbols $E_c$ and $E_v$ designate the lower and upper levels of the conduction band or valency band. The symbol $E_f$ designates the Fermi level, that is to say the energy level for which the occupation probability is 0.5. In the band diagram, the band curves are such that an electron accumulation zone 17 is formed. Free electrons originating from the region 18 of $Ga_{1-x}Al_xAs$ (Si-doped) leave the latter due to the difference in electronic affinity between the two materials and are accumulated at the lowest levels of free energy in this thin region 17 near the interface. A thin undoped layer 19 in the material $Ga_{1-x}Al_xAs$ is intended to grant a good separation between the donor impurities (for example, Si) and this layer of localized electrons. This layer of localized electrons 17 forms a kind of two-dimensional quasi Fermi-Dirac gas, while the polarization means 13 permit bringing it to the desired potential, on the order of a few tenths of a volt, for example, 0.2 V, with respect to the source, and of thus controlling the lower level of the potential well.

Figure 6A:
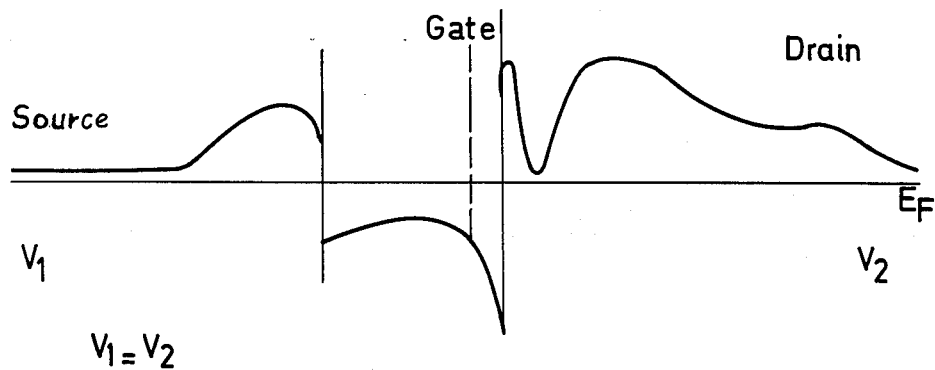
FIGS. 6a, 6b and 6c show the diagram of bands of this novel hetero-structure, both quiescently and in operation.
Figure 6B:
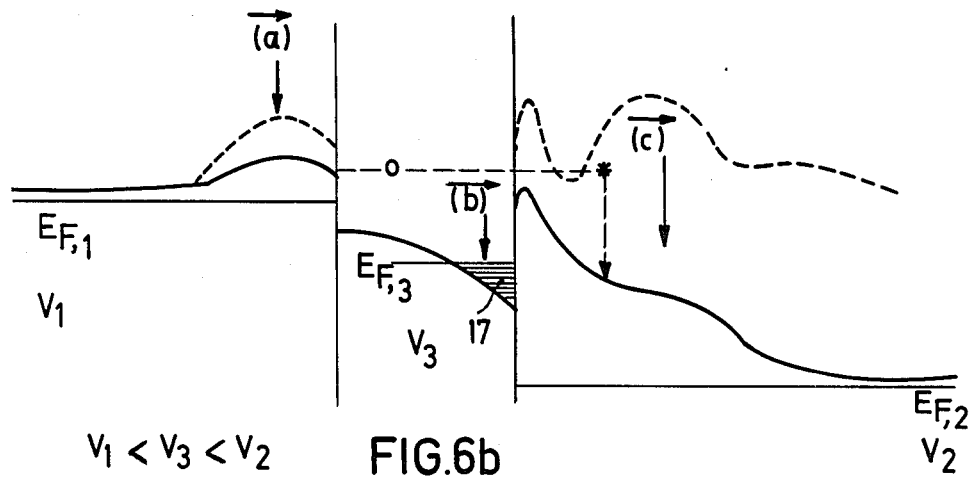
Figure 6C:
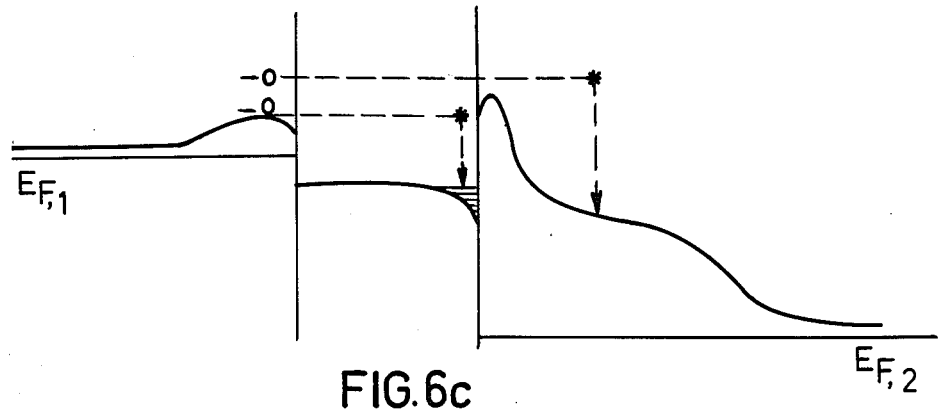

Finally, FIG. 6 shows the band diagrams of the device assembly at the same potential (FIG. 6-a) or in the polarized state (FIG. 6-b and 6-c). When the two materials are at the same potential $V_1=V_2$, the band diagram (FIG. 6-a) causes a potential well to appear such that the source-drain current is zero. When the potentials are not equal, if $V_1<V_2$, electrons emitted by the source can traverse this potential well.

Moreover, the gate region being sufficiently thin and freed from impurities, the electron transfer is effected through this region by a ballistic effect. The term "ballistic effect" is to be understood to mean herein that the charge carrier, in this case the electron, is accelerated without a noticeable collision either with the impurities present in the crystal lattice or with the phonons (lattice vibrations) over a distance less than a critical (so-called free) path length.

At lower operating temperatures, for example, of the order of 77° K., at which only the phenomenon of collision with the impurities is predominant ("impurity scattering"), the mean free pathlength before the collision is larger, for example, of the order of a micron.

FIG. 6-b shows the band diagram when the source potential ($V_1$) is lower than the drain potential ($V_2$) and the potential ($V_3$) has an intermediate value:

$$V_1<V_3<V_2.$$

The influence on the band diagram of this potential distribution is as follows: On the one hand, a smoothing (arrow a) of the first potential peak in the source region, on the other hand a tilting (arrow b) of the band level about the quasi Fermi level in the potential well of the gate region, causing the formation of an electron accumulation zone 17, finally a lowering (arrow c) of the curve below the level of the first potential peak in the drain region.

The operation of such a device is then clearly apparent: free electrons originating from the source region leave the latter due to the polarization, traverse the gate region by a ballistic effect and return to the state of equilibrium in the drain region mainly by interaction with an impurity (impurity scattering), this interaction being represented by an asterisk in this diagram.

A fraction α of the electrons emitted by the source owing to the potential difference between source and gate pass the gate region with a sufficient energy and pulse storage so that these electrons traverse the discontinuity in the conduction band between the gate and drain regions. The value of the flow of electrons emitted by the source is determined by the potential difference between source and gate. The potential of the gate is fixed by the two-dimensional quasi Fermi level of the electron gas.

Two modes of operation of the device can be distinguished:

(1) Application as a FET: $\alpha \approx 1$. The current in the gate is small with respect to the current of the drain;

(2) $\alpha < 1$. Between gate and source there is a negative resistance. FIG. 6-c shows schematically the band diagram in this application, in which only a part of the electrons can traverse the potential well.

Its operation in the first case can be similar to that of a vacuum tube in which also a movement of charge carriers of a single sign (electrons) under the influence of an electric field produced by the potential difference between emission electrode (cathode) and a reception electrode (wafer) takes place, the current being modulated by the potential of an intermediate electrode (gate).

However, the device according to the invention has properties more interesting than any of the devices known thus far, especially in that the maximum transition frequency $f_T$, which can be approached by the following formula:

$$f_T = \frac{1}{1\, C_{GS}\, R_G}$$

is higher than 100 GHz.

It is clear to those skilled in the art that numerous modifications of the invention can be realized without departing from the scope of the invention.

What is claimed:

1. A hetero-junction ballistic transistor comprising a first layer of a substantially undoped first semiconductor material forming a gate region, a second layer of a second semiconductor material forming at least part of a drain region, said first layer forming a hetero-junction with said second layer, a third layer of a third semiconductor material forming at least part of a source region, said source and drain regions being doped to a common conductivity type, said first layer being situated between said second and third layers and being thinner than the free mean path length of the majority charge carriers of said source and drain regions, thus permitting a ballistic flow of said majority carriers over the gate region, said first and second semiconductor materials being so chosen that at said hetero-junction the lower level of the conduction band in said first semiconductor material is below that in said second semiconductor material, and means for applying source, drain and gate voltages to said source, drain and gate regions, respectively, for generating a flow of majority charge carriers from said source region to said drain region over said gate region substantially perpendicular to said hetero-junction, and for creating a two-dimensional electron gas in said gate region at said hetero-junction for controlling said flow of majority charge carriers.

2. A semiconductor device as claimed in claim 1, characterized in that the first semiconductor material is gallium arsenide, while the second and third semiconductor materials are both gallium aluminum arsenide of the same conductivity type.

3. A semiconductor device as claimed in claim 2, characterized in that the drain region comprises a stack on a semiconductor substrate with at least a layer of gallium arsenide very highly n++-doped with a doping of the order of $10^{18}$ atoms/cm$^3$, having a thickness of approximately 0.5 μm, a layer of gallium arsenide undoped or weakly n-doped with a doping of the order of $10^{16}$ atoms/cm$^3$ and having a thickness of approximately 0.5 μm, and a layer of gallium aluminum arsenide (Ga$_{1-x}$Al$_x$As) which is n-doped and has a thickness of approximately 100 nm.

4. A semiconductor device as claimed in claim 3, characterized in that the layer of Ga$_{1-x}$Al$_x$As is weakly n-doped with a doping of the order of $10^{\neq}$atoms/cm$^3$.

5. A semiconductor device as claimed in claim 3, characterized in that the layer of Ga$_{1-x}$Al$_x$As comprises three zones, in the proximity of the upper layer a first undoped zone having a thickness of approximately 5 nm and with x varying continuously from 0.2 to 0.3 then a second zone very highly n++-doped with a doping level higher than $10^{18}$ atoms/cm$^3$, having a thickness of approximately 10 nm and with x having a constant value of about 0.3, and finally a third undoped zone having a thickness of approximately 85 nm and a value x which is about 0.3 over the major part of the zone and decreases at the end of the zone.

6. A semiconductor device as claimed in claim 3, characterized in that the layer of Ga$_{1-x}$Al$_x$As is undoped and in that the value x starts from a level of 0.2, increases to 0.3 and remains constant at this value over a substantial part of the thickness of the layer and then decreases at the end of the zone.

7. A semiconductor device as claimed in claim 1 or 2, characterized in that the gate region comprises a layer of undoped GaAs, while the gate contact is obtained by a layer in ohmic contact with said layer of undoped GaAs.

8. A semiconductor device as claimed in claim 7, characterized in that the gate contact is obtained by a layer comprising of a gold layer on a germanium layer forming an ohmic contact with said layer of undoped GaAs.

9. A semiconductor device as claimed in claim 1, characterized in that the source region comprises a layer of undoped gallium aluminum arsenide having a thickness of the order of 25 nm and by another layer also of gallium aluminum arsenide and having a doping level higher than $10^{18}$ atoms/cm$^3$ and a thickness of the order of 200 nm, on which there is provided a source contact.

10. A semiconductor device as claimed in claim 9, characterized in that the source contact is provided in the form of a first layer of n-type gallium arsenide having a doping between $10^{17}$ and $10^{18}$ atoms/cm$^3$, a second layer of n-type germanium doped with arsenic at $10^{20}$ atoms/cm$^3$ and a third metallic layer chosen from the group consisting of gold and aluminum.

11. A ballistic transport transistor comprising:

a first layer of a first semiconductor material, said first layer containing doped impurities of a first conductivity type and a first level;

a second layer of a second semiconductor material different from said first semiconductor material, said second layer being less heavily doped than said first layer, said second layer having an interface with said first layer, the work functions and forbidden gaps of said first and second layers being such that a portion of said second layer adjacent said interface contains current carriers of said first conductivity type due to the doping in said first layer adjacent said interface;

a third layer of semiconductor material being doped to contain carriers of said first conductivity type, said third layer being separated from said first layer by said second layer, such that said portion of said second layer lies between said first layer and said third layer, all of said doped layers being of said first conductivity type;

means for contacting said first layer, means for contacting said third layer, and means for providing electrical connection to said portion of said second layer;

said portion of said second layer containing said current carriers being thinner, in a direction measured along a line extending perpendicularly from said interface, than the mean free path of said current carriers in said portion; and means for causing, upon application of a voltage between said third layer and said means for providing electrical connection to said portion of said second layer of such polarity as to cause current carriers of said first conductivity type to move from said third layer toward said portion, at least some of said current carriers which were caused to move to pass through said portion into said first layer without scattering in said portion.

* * * * *